United States Patent [19]

Kitagawa

[11] Patent Number: 4,622,106

[45] Date of Patent: Nov. 11, 1986

[54] METHODS FOR PRODUCING PRINTED CIRCUITS

[75] Inventor: Naoaki Kitagawa, Kanagawa, Japan

[73] Assignee: Marui Industry Co., Ltd., Tokyo, Japan

[21] Appl. No.: 612,785

[22] Filed: May 22, 1984

[30] Foreign Application Priority Data

May 23, 1983 [JP] Japan ................... 58-90523

[51] Int. Cl.$^4$ ............................... C25D 5/02
[52] U.S. Cl. ..................... 204/15; 204/38.4
[58] Field of Search .............. 204/15, 38.4, 192 R

[56] References Cited

U.S. PATENT DOCUMENTS

| | | | |
|---|---|---|---|
| 2,728,693 | 12/1955 | Cado | 204/15 |
| 2,884,571 | 4/1959 | Hannahs | 204/15 |
| 2,958,928 | 11/1960 | Bain, Jr. | 204/15 |
| 3,143,484 | 8/1964 | Olin | 204/15 |
| 3,528,893 | 9/1970 | Christie | 204/38.4 |
| 3,702,808 | 11/1972 | Smith | 204/38.4 |
| 3,737,380 | 6/1973 | Bachmeier | 204/15 |
| 4,175,010 | 11/1979 | Koel | 204/15 |

FOREIGN PATENT DOCUMENTS 55-36198 9/1980 Japan .................. 204/15

*Primary Examiner*—T. M. Tufariello
*Attorney, Agent, or Firm*—Wenderoth, Lind & Ponack

[57] ABSTRACT

A printed circuit board is produced by forming a masking layer with a non-masking circuit pattern on the surface of a base plate by an ink which can be detached from the plate forming a metal layer on the plate with the masking layer by vacuum evaporation or sputtering, and then removing the ink of the masking layer and the metal provided thereon from the base plate, leaving the remaining metal as a circuit. To produce a circuit board with a circuit consisting of many metal portions which are separated and insulated from each other, after forming the metal layer, the following steps are effected: forming a second masking layer on the metal layer, the second layer having a non-masking circuit pattern which is the same as that of the first masking layer, the pattern of the second layer being aligned with that of the first layer, then plating the plate by putting the plate into a plating bath and connecting a plating electrode to the metal layer so that additional metal is plated on those portions of the metal layer which are not masked by the second masking layer, and removing the ink of the first masking layer and the metal thereon and the second masking layer provided on the first masking layer, leaving the remaining metal as a circuit.

7 Claims, 2 Drawing Figures

METHODS FOR PRODUCING PRINTED CIRCUITS

BACKGROUND OF THE INVENTION

This invention relates to methods for producing printed circuits.

Among the various methods for producing printed circuits, a typical one is as follows:

An insulating board is coated with a thin copper plate or a copper foil and a protective film is deposited, photographically or by silk-screening, in the pattern desired for the circuit. The unprotected copper is then etched away in an acid bath. The remaining conductive copper is left intact in the pattern of the circuit.

However, in such a method, a great deal of copper is wasted in the etching process and it is required to process the waste fluid containing the acid used in the etching process and copper.

SUMMARY OF THE INVENTION

Accordingly, an object of the present invention is to provide methods for producing printed circuits in such a way that the above stated defects in the prior art are eliminated.

The methods of this invention include steps which are similar to those of the method disclosed in U.S. Ser. No. 546,304 filed on Oct. 28, 1983 by Shigeru Nakagawa et al. (which has been assigned to the assignee of this application). However, the method of the latter relates to a method for forming a metal layer with desired patterns including characters, marks and the like which are not coated with metal on the surface of a member such as a synthetic resin plate or a ceramic plate and is not directed to production of printed circuits as does the present invention.

A first method in accordance with the present invention comprises the steps of: forming a masking layer with a non-masking circuit pattern on the surface of a base plate by an ink which can be detached from the plate, forming a metal layer on the plate with the masking layer by vacuum evaporation or sputtering, and then removing the ink of the masking layer and the metal provided thereon from the base plate, leaving a remaining metal as the circuit.

The metal layer formed on the base plate by vacuum evaporation or sputtering can be made substantially thinner than the metal foil used in the prior art, and the thickness of the metal layer can be controlled in accordance with necessity. Further, if necessary, the printed circuit obtained through the process stated above can be subjected to a plating process to increase the thickness of the metal of the circuit so as to reduce the electrical resistivity thereof to a desired value.

From the above, it will be noted that, as compared with the prior art, the amount of metal wasted in the circuit producing method of the present invention is quite small and there is no problem concerning the waste liquid as is found in the prior art.

When the circuit board produced through the above stated steps has many metal portions forming the circuit which are separated and insulated from each other, in the plating process stated above it is required to connect plating electrodes to the respective metal portions. However, such connecting operation is difficult and might in fact be impossible.

Thus, in a second method of this invention, the following steps are effected: after the second step of the first method, i.e., forming the metal layer on the base plate having the masking layer, a second masking layer with a non-masking circuit pattern which is the same as that of the first masking layer is provided on the metal layer so that the pattern of the second masking layer is aligned with that of the first masking layer, and then the base plate with these masking layers is subjected to the plating process. In this plating process, even if the metal portions which are not protected by the second masking layer are separated from each other, only one electrode is required to be connected to the metal layer because those portions are just parts in the metal layer under the second masking layer. After the plating process, as in the first method, the first masking layer and the materials provided thereon, i.e., the metal and the second masking layer, are removed, whereby a printed circuit board with a desired circuit can be obtained.

As compared with the prior art, it will be understood that the second method can also eliminate the defects of the prior art.

In the second method, if the portions of the metal layer corresponding to the non-masking circuit pattern are partly masked by additional portions of the second masking layer, such partially masked parts will not be placed in the plating process and thus are made to be portions of higher resistivity.

The invention, its objects and its advantages, will become more apparent from the following detailed description of the preferred embodiments presented below.

BRIEF DESCRIPTION OF THE DRAWINGS

In the detailed description of the preferred embodiments of the invention, reference is made to the accompanying drawings, in which.

Figure 1:
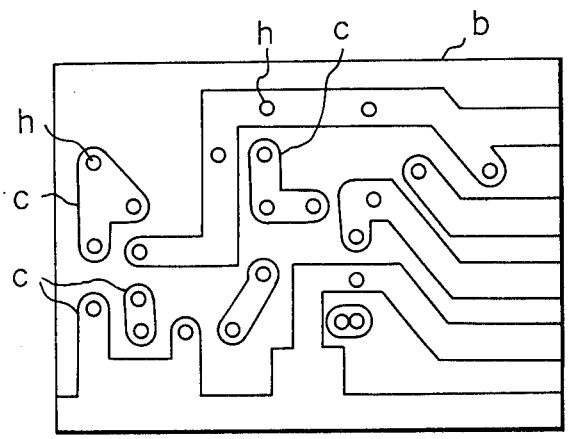
FIG. 1 is a plan view of one example of printed circuit boards to be produced by the present invention.
Figure 2:
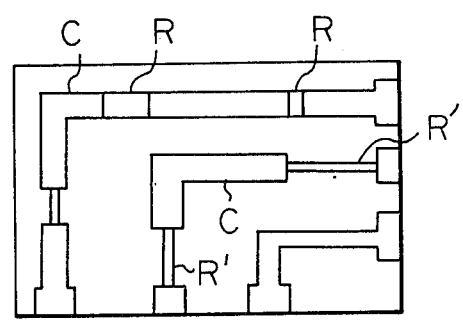
FIG. 2 is a plan view of another example of printed circuit boards to be produced by the present invention, the board including some resistances in the circuit.

DETAILED DESCRIPTION OF THE PREFERRED EMBODIMENTS (I) An embodiment of the first method of the present invention will be described below.

The basic plate of the printed circuit board may be made of ceramics, plastics or other insulating materials.

The basic plate is first provided with a base coating by spraying paint of polyester, acrylic resin, epoxy resin or the like in order to enhance the adhering force to the basic plate of a metal layer which will be formed later by vacuum evaporation or sputtering.

Then, a masking layer is formed by printing with a water base ink or an oil ink. The masking layer includes a desired non-masking pattern corresponding to a circuit to be formed.

Then, the plate is subjected to the vacuum evaporation process or sputtering process to form the metal layer thereon. Copper, nickel or other metals which have high conductivity may be used.

After forming the metal layer, the plate is put into an ink removing solvent (for example, a solution of sodium hydroxide) to dissolve the printed ink, thus removing it and the metal provided on the ink. In this process, supersonic vibrations may be applied to the plate to thereby facilitate the removal of the ink and the metal.

Through the above stated steps, a printed circuit board is obtained which is provided with a circuit formed by the metal left on the plate.

If it is desired to form a circuit board which includes a circuit having relatively high resistance values, the process for producing the circuit board is terminated at this stage. Desired resistance values can be obtained by adjusting the thickness and the width of the metal forming the circuit. When it is desired to obtain a circuit board with a circuit having a relatively low resistance value, the circuit board is further subjected to a plating process to make the thickness of the metal forming the circuit greater so as to reduce the resistance value to a desired figure.

When copper plating is effected, a copper sulfate solution will be best as the plating bath, and when a nickel plating process is effected, a nickel sulfamate solution will be best.

Instead of the provision of the base coating stated above, the surface of the base plate may be subjected to a plasma discharging process in order to increase the adhering force of the metal layer to the surface.

Further, it is advisable to provide through-holes (h) for receiving the terminals of electronic elements in the base plate before forming the metal layer, because the metal will stick to the walls of the holes during vacuum evaporation or sputtering.

The following table shows examples of the circuits formed by the first method of this invention.

base plate provided with these masking layers is subjected to the plating process by putting the base plate into the plating bath and connecting one plating electrode to a portion of the preformed metal layer. As noted above, when copper plating is effected, a copper sulfate solution will be best as the plating bath, and when nickel plating is effected, a nickel sulfamate solution will be best.

By this plating process, the metal is deposited on those metal portions which are not protected by the second masking layer to thereby increase them in thickness. The values of the relevant thickness are determined in accordance with the values of resistivity of the conductive portions of the circuit.

After the plating process, the first masking layer, the associated metal layer and the second masking layer thereon are removed from the surface of the base plate leaving the remaining metal as the conductive portions of the circuit. This removing process is effected in the same way as in the first method.

If it is desired to produce a circuit containing portions (R) which are thinner than other circuit portions and thus are of high resistivity, additional masking portions are added to the second masking layer so that the additional portions are located at those positions where the thin circuit portions (R) are to be formed. The portions of the metal layer masked by the additional masking portions are not provided with an additional plated metal layer, so those portions become high resistivity portions (R). Further, it is possible to form another type of high resistivity portion (R') by using the first masking

| Metals of the circuit formed by vacuum evaporation of sputtering | Thickness of the metal pattern of the left circuit | Sheet resistivity of the metal pattern | Plated metal | Thickness of the plated metal | Sheet resistivity of the final metal pattern |
|---|---|---|---|---|---|
| Ni (vacuum evaporation) | 1000Å | 4.0–5.0 $\Omega/cm^2$ | Nickel | 0.85μ | 0.11 $\Omega/cm^2$ |
| Ni (vacuum evaporation) | 1000Å | 4.0–5.0 $\Omega/cm^2$ | Nickel | 5.12μ | 0.02 $\Omega/cm^2$ |
| Cu (vacuum evaporation) | 800Å | 6.0–6.5 $\Omega/cm^2$ | Copper | 0.7μ | 0.03 $\Omega/cm^2$ |
| Cu (vacuum evaporation) | 1200Å | 4.0–4.5 $\Omega/cm^2$ | Copper | 4.24μ | less than 0.004 $\Omega/cm^2$ |
| Cu (sputtering) | 1350Å | 2.5–3.0 $\Omega/cm^2$ | Copper | 3.9μ | less than 0.004 $\Omega/cm^2$ |
| Cu (sputtering) | 1350Å | 2.5–3.0 $\Omega/cm^2$ | Copper | 7.7μ | less than 0.004 $\Omega/cm^2$ |
| Cu (sputtering) | 3800Å | 0.8–1.0 $\Omega/cm^2$ | Copper | 5.0μ | less than 0.004 $\Omega/cm^2$ |

(II) Next, an embodiment of the second method of the present invention will be described below.

As noted above, if there are many conductive portions (c) forming the circuit of the circuit board (b) which are separated and insulated from each other, it becomes difficult or impossible to connect plating electrodes to the respective conductive portions (c) in the plating process of the first method stated above. In such a case, it is advisable to use the second method. In the second method, after the provision of the metal layer on the masking layer, a second masking layer which has the same circuit pattern as that of the first masking layer is provided on the metal layer in such a way that the non-masking circuit patterns of the first and second masking layer are aligned with each other and, then, the layer including the circuit pattern containing these narrow portions. These are small in width and thus have higher resistivity than those of the other conductive portions.

The following table shows the relation between the thickness and the resistivity of a resistant portion.

| Metal | Resistivity | Metal | Resistivity |
|---|---|---|---|
| evaporated copper 380Å | 76 $\Omega/cm^2$ | sputtered copper 420Å | 52.6 $\Omega/cm^2$ |
| | | sputtered copper 1000Å | 3.4 $\Omega/cm^2$ |
| evaporated | 3.4 $\Omega/cm^2$ | sputtered | 1.7 $\Omega/cm^2$ |

-continued

| Metal | Resistivity | Metal | Resistivity |
| --- | --- | --- | --- |
| copper 1500Å evaporated | 0.9 Ω/cm² | copper 2200Å sputtered | 0.89 Ω/cm² |
| copper 4000Å | | copper 3800Å | |

What is claimed is:

1. A method for producing a printed circuit board including the steps of:

printing on a surface of a base plate a first masking layer having a non-masking circuit pattern from an ink which can be detached from said plate;

forming a metal layer on said plate provided with said first masking layer by vacuum evaporation or sputtering;

forming a second masking layer on said metal layer, said second masking layer covering portions of said metal layer corresponding to areas other than said non-masking circuit pattern and covering desired portions of said metal layer corresponding to said non-masking pattern;

then, plating said plate by placing said plate in a plating bath and connecting a plating electrode to said metal layer so that additional metal is deposited onto portions of said metal layer not masked by said second masking layer; and removing said ink of said first masking layer and said metal thereon and said second masking layer, thereby leaving remaining metal as a circuit including relatively thick, low resistivity portions corresponding to said portions of said metal layer not masked by said second masking layer and relatively thin, high resistivity portions corresponding to said portions of said metal layer covered by said second masking layer.

2. A method according to claim 1, wherein said step of removing comprises placing said plate in a solvent for dissolving said ink of said first masking layer to remove said ink and the materials thereon from said base plate.

3. A method according to claim 2, wherein a water ink is used as a material forming said first masking layer, and a solution of sodium hydroxide is used as said solvent.

4. A method according to claim 1, further comprising, before the step of printing said first masking layer, coating an organic based paint on said surface of said base plate to enhance the adhering force of said metal layer to said base plate.

5. A method according to claim 1, further comprising, before printing said first masking layer, subjecting said surface of said base plate to a plasma discharging process to enhance the adhering force of said metal layer to said base plate.

6. A method according to claim 1, further comprising, before forming said metal layer, providing said base plate with through-holes which are adapted to receive the terminals of electric elements.

7. A method according to claim 1, wherein said step of removing comprises placing said plate in a solvent for dissolving said ink of said first masking layer, and applying supersonic vibrations to said plate to thereby remove said ink and the materials thereon.

* * * * *